United States Patent [19]
Donnelly, Jr. et al.

[11] Patent Number: 6,143,658
[45] Date of Patent: Nov. 7, 2000

[54] MULTILEVEL WIRING STRUCTURE AND METHOD OF FABRICATING A MULTILEVEL WIRING STRUCTURE

[75] Inventors: Vincent Michael Donnelly, Jr., Berkeley Heights, N.J.; Kazuyoshi Ueno, Kanagawa, Japan

[73] Assignee: Lucent Technologies Inc., Murray Hill, N.J.

[21] Appl. No.: 09/398,977

[22] Filed: Sep. 17, 1999

Related U.S. Application Data

[62] Division of application No. 08/988,098, Dec. 10, 1997, abandoned.
[60] Provisional application No. 60/033,051, Dec. 12, 1996.

[51] Int. Cl.$^7$ ..................................................... H01L 21/44
[52] U.S. Cl. .......................... 438/687; 438/652; 438/656; 438/672; 438/675
[58] Field of Search ..................... 438/652, 653, 438/656, 666, 667, 668, 672, 675, 687

[56] References Cited

U.S. PATENT DOCUMENTS

| | | | |
|---|---|---|---|
| 5,759,915 | 6/1998 | Matsunaga et al. | 438/672 |
| 5,968,333 | 10/1999 | Nogami et al. | 438/687 |
| 5,980,720 | 11/1999 | Park et al. | 438/687 |
| 6,001,727 | 12/1999 | Ohmi et al. | 438/687 |

*Primary Examiner*—Kevin M. Picardat
*Attorney, Agent, or Firm*—Richard J. Botos; Ozer M. N. Teitelbaum

[57] ABSTRACT

The present invention is directed to a device that has wires on at least two levels. The wires are either copper or a metal containing copper. At lease one via plug formed of copper or a metal containing copper is formed which electrically connects at least one wire on the first level with at least one wire on the second level. The device is fabricated under conditions that remove oxides and other metal that form on the exposed surface of the first level of metal during processing prior to the via plug being formed. The resulting interconnect between the first level of metal and the via plus is substantially non-oxidized copper or copper-containing metal.

6 Claims, 4 Drawing Sheets

MULTILEVEL WIRING STRUCTURE AND METHOD OF FABRICATING A MULTILEVEL WIRING STRUCTURE

CROSS-REFERENCE TO RELATED APPLICATION

This is a divisional of application Ser. No. 08/988,098, filed on Dec. 10, 1997, now abandoned.

This application claims priority of Provisional Application Serial No. 60/033,051 filed Dec. 12, 1996.

BACKGROUND OF THE INVENTION

1. Technical Field of the Invention

The present invention relates to a multilevel wiring structure used in semiconductor devices, in which wires are formed of either copper or a material containing copper as a principle component, and to a method of fabricating such a structure.

2. Art Background

With the improvement in integration in semiconductor devices, problems such as an increase in wiring delay, deterioration in reliability of the wiring, and so on occur. As a method of solving the problems, copper wiring lines having a resistivity which is lower than that of conventional aluminum (Al) alloy wiring lines are being actively developed. In the context of integrated circuit devices, the wiring lines are formed by defining grooves or trenches in a substrate and filling those grooves or trenches with conductive material. For convenience, wiring lines are hereinafter referred to as wires. Copper wires, however, oxidize easily and the oxidized copper has inferior electrical properties to unoxidized copper. Therefore, it is difficult to fabricate a multilevel structure due to the copper oxidation that occurs during the process.

Copper also diffuses quickly in silicon (Si) and oxidized Si ($SiO_2$). When copper diffuses into an insulating film such as $SiO_2$, there is a possibility of deterioration in the device characteristics such as an increase in leakage current between wires, an increase in a leakage current at junctions, and the like. To avoid this problem, the multilevel metal structure shown in FIG. 1 was proposed. According to the conventional multilevel structure, tantalum (Ta) or the like is sandwiched as a barrier metal 10, which prevents the diffusion of copper, between the copper 60 and the $SiO_2$ film 20. According to this structure, a boron implantation layer 30 which acts to suppress oxidation of copper is applied over the surface of a wiring 40 of the first layer. The first level of wire 40 and the second level of wire 50 are electrically connected by via plugs 60, each surrounded by a barrier metal 10.

The multilevel wiring structure depicted in FIG. 1 is fabricated by immersing the substrate into a dilute hydrofluoric acid solution as a pretreatment for forming the via plug. The copper surface is thereby subjected to a cleaning treatment in the dilute hydrofluoric acid solution, obtained by mixing 1 part by volume of hydrofluoric acid with 50 parts by volume of pure water, just before the barrier Ta is deposited. Typically, the diameter of a via hole is equal to 0.3 microns or less in the device depicted in FIG. 1.

The contact resistivity at the via connecting portion of the structure depicted in FIG. 1 is $1.5 \times 10^{-8}$ $\Omega\text{-cm}^2$. When the contact resistance of a via connection having a diameter of 0.3 μm is calculated from the above contact resistivity, a large value of 21 Ω is obtained so that an increased wiring delay occurs. In order to suppress this increase in the wiring delay, it is necessary to set the resistivity per via hole to approximately 2 Ω or less, which corresponds to $1/10$ of the conventional value.

SUMMARY OF THE INVENTION

The present invention is a multilevel wiring structure with copper interconnects that has, a decreased contact resistance compared with devices that have a barrier layer of metal such as tantalum between the copper interconnect and the first level of metal in the device. The present invention is also directed to a process for making this device.

The multilevel wiring structure of the present invention is characterized in that the wire of the first level in the device is either copper or a metal containing copper as a principle component and the connection between the wire in the first level and the via plugs is also copper or a copper-containing alloy. Further, a barrier material exists on at least a portion of the side faces of a via hole, but the barrier layer is not interposed between the copper or copper-containing metal in the via and the copper or copper-containing metal in the first level of wiring in the device.

The method of fabricating the device of the present invention is directed to that aspect of fabricating the interconnect between the first level of metal wiring and the metal in the via plug. Accordingly, the process of the present invention is used in conjunction with any process for forming devices with multilevel wiring in which copper or copper containing metal is desired for both the wires in the device and the via plugs that form electrical interconnection between the different levels of wire. In one embodiment of the present invention, the process is integrated with a process in which the following structure has been formed. The structure has copper or copper-containing metal deposited in trenches. The trenches are formed in a layer of $SiO_2$ and lined with a material that acts as a barrier to copper diffusion. The top surface of the metal is exposed. Two layers of material are formed over this structure, the first layer being an insulating material such as SiN which acts as a barrier to copper diffusion, over which is formed an insulating layer of $SiO_2$. Via holes that communicate with the surface of the metal wires are formed in the two layers of material. One skilled in the art will appreciate that the above-described structure is manufacturable using conventional techniques.

In the process of the present invention, a structure such as the one previously described in subjected to the following sequence of processing steps. First, a layer of metal that acts as a barrier to the diffusion of copper into silicon or $SiO_2$ is formed over the structure which has vias formed therein. One example of a suitable metal is TiN, but other suitable metals will be readily apparent to one skilled in the art. After the barrier metal is deposited, it is etched back by anisotropic reactive ion etching. The barrier metal is left on the side faces of the via hole and the barrier metal on the bottom of the via hole is removed, thereby exposing the underlying copper metal. After that, as a cleaning treatment, the structure is subjected to an oxygen or a hydrogen plasma, followed by immersion in a dilute hydrofluoric acid solution. The structure is then subjected to a reagent that either extracts the oxygen from the copper metal, or removes the oxidized copper from the surface of the copper metal. One example of a suitable reactant is hexafluoro-acetyl-acetone (Hhfac) gas. The interaction between oxidized copper metal and Hhfac gas is described in Beck, S. E., et al., "Reaction of 1,1,1,5,5,5-Hexafluoro-2,4-pentadione ($H^+$hfac) with CuO, $Cu_2O$, and Cu films," *J. Electrochem. Soc.*, Vol. 42:3, pp. 961–965 (March 1995) which is hereby incorporated by reference. It is advantageous if the reactant is in the gas phase so that it is not necessary to remove the cleaned article from the chamber in which it was cleaned before copper metal is formed in the via.

After the above-described cleaning process, copper or copper-containing alloy is formed in the via. In one embodiment of the present invention, the structure is subjected to the Hhfac gas and the subsequent copper deposition step in a vacuum environment.

In the multilevel wiring structure of the present invention, since there is no non-copper or non-copper alloy interposed between the via plug and the metal wires, the resistivity between the copper wire and the via plug is lower than in devices where a non-copper metal such as Ta is interposed between the metal wire and the via plug. The highly resistive oxide that forms on the surface of copper wire is substantially removed by the Hhfac gas process and, therefore, it is required by the process that the Hhfac gas cleaning step be the last step in the cleaning sequence. Re-oxidation of the copper by exposure to the atmosphere is further prevented by the embodiment of the present invention in which the structure is subjected to the Hhfac gas followed by copper formation in the via in a vacuum environment. The Hhfac process and the deposition of copper are easily performed in the same chamber by changing the gases supplied, so that the process of the present invention does not add additional processing complexity.

DETAILED DESCRIPTION

Figure 1:
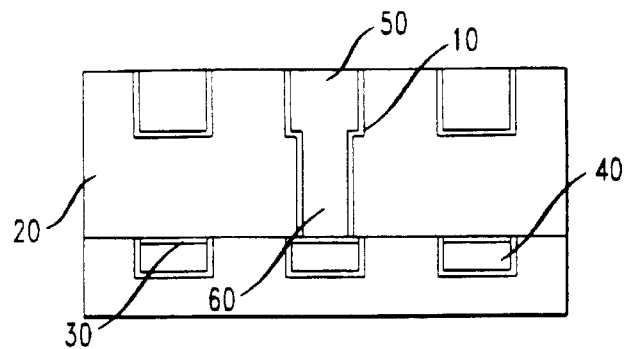
FIG. 1 is a diagram showing a prior art multilevel wiring structure.
Figure 2:
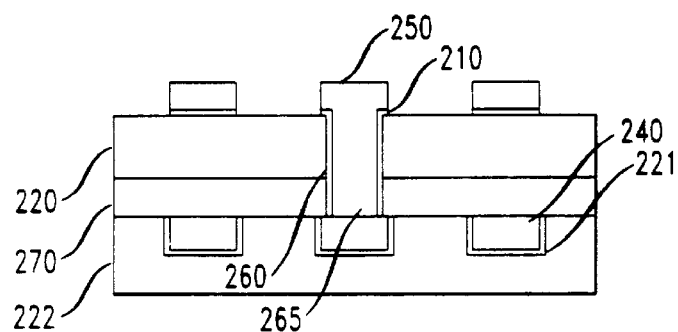
FIG. 2 is a cross-sectional view of a first embodiment of a multilevel wiring structure of the invention.

FIG. 2 is a cross sectional view showing a first embodiment of a multilevel wiring structure of the invention.

In the embodiment of FIG. 2, a wire 240 of the first layer is provided in a groove 221, formed in an SiO$_2$ oxide film 222. An insulating film between wire levels is constructed by laminating the structure with an Si nitride film 270 followed by an SiO$_2$ film 220. A barrier metal 210 made of nitride titanium (TiN) is provided on the sides of a via plug 260. The via plug 265 is filled with copper. The second level of wire 250 is formed on the copper-filled via 265. The interfaces of the via plug 265 and the surface of the first level of wire 240 are, therefore, a junction made of two copper-containing metals.

Figure 3:
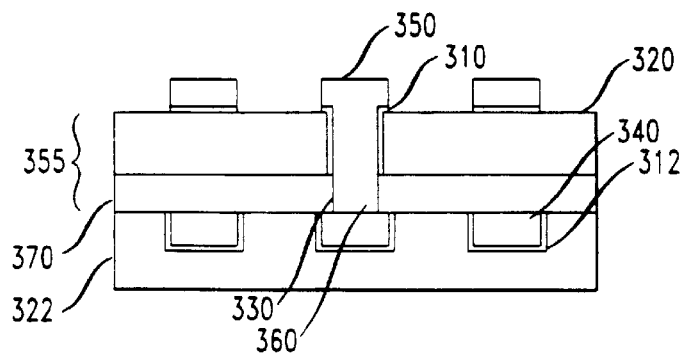
FIG. 3 is a cross-sectional view of a second embodiment of the multilevel wiring structure of the invention.

FIG. 3 is a cross sectional view showing the multilevel wiring structure according to a second embodiment of the invention.

In a manner similar to FIG. 2, the wire 340 is formed in the grooves 312 formed in the SiO$_2$ film 322. Insulating films of SiN 370 and SiO$_2$ 320 are formed over the structure. Via holes 330 are then formed in the insulating film 355. A barrier metal layer 310 of titanium nitride (TiN) is formed selectively on the SiO$_2$ side faces of the via hole 330 by forming the via in the SiO$_2$ layer, forming the TiN on the sidewalls of the via in the SiO$_2$ layer, and then forming the via through the SiN layer. The TiN barrier 310 is not formed on the SiN 370 side faces of the via hole 330. The via plug 360 is formed by filling the via 330 with copper. The second level of wire 350 is formed on the via plug 360. It is advantageous, although not required, for the via plug 360 and the second level of wire 350 to be formed in the same deposition step. Such continuous deposition avoids the need for additional cleaning of the copper that would likely be required if the via plug and second level of wire were formed in separate steps with intervening process steps performed in between.

Figure 4:
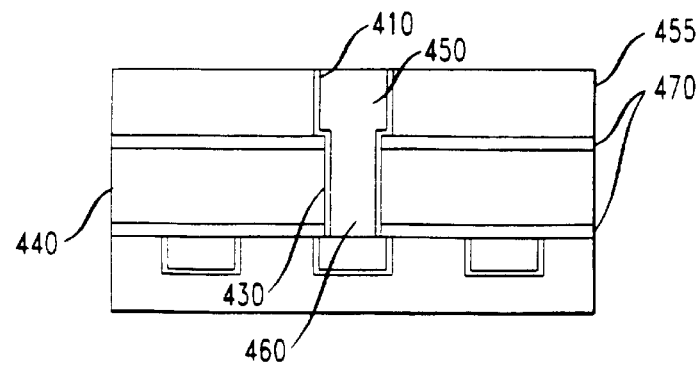
FIG. 4 is a cross sectional view of a third embodiment of the multilevel wiring structure of the invention.

FIG. 4 is a cross sectional view showing a third embodiment of the invention. The structure of the via plug 460 (copper-filled via 430) in FIG. 4 is the same as that of the first embodiment of FIG. 2 but the structure is leveled by embedding the upper level of wire 450 in an insulating film 455. The TiN barrier metal 410 exists on the sides of the upper level wire 450 and on the sides of via plug 460. An SiN layer 470 that functions as an etch stop and a barrier to copper diffusion is formed on both sides of the oxide layer 440.

It is readily apparent to one skilled in the art that the embodiment depicted in FIG. 3 wherein the barrier metal is formed selectively on the SiO$_2$ sidewall of the via is easily incorporated into the structure depicted in FIG. 4.

The process of the present invention is described in terms of the following examples. Although the thickness of the various layers of material formed in the following exemplary processing sequences is specified, the thickness of the various layers is not critical to the process of the present invention. The present process is directed to the cleaning of copper metal before copper is formed thereon to provide a low resistance copper-to-copper interface. As such, one skilled in the art will appreciate that the thicknesses of the various layers in the examples below are for purposes of illustration only, and that the present process is not limited by the thicknesses expressed below.

Figure 5A:
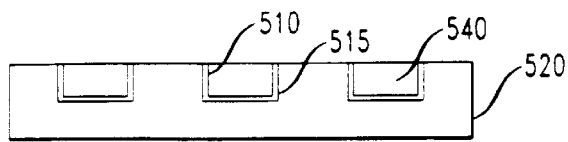
FIGS. 5(A)–5(E) illustrate the process used to form the device in FIG. 3.

As shown in FIG. 5(A), the copper wire 540 of the first level is first formed in a layer of SiO$_2$. The wire 540 of the first level is fabricated by forming a groove 510 having a depth of 500 nm in the SiO$_2$ film 520. A 20 nm-thick TiN film 515 is deposited as a barrier metal over the entire surface using a conventional CVD technique. A copper film with a film thickness of 800 nm is deposited on the structure using conventional CVD techniques. The copper and the barrier metal are then polished down by chemical mechanical polishing (CMP), thereby leaving only copper 540 and the barrier metal 515 in the grooves 510.

Figure 5B:
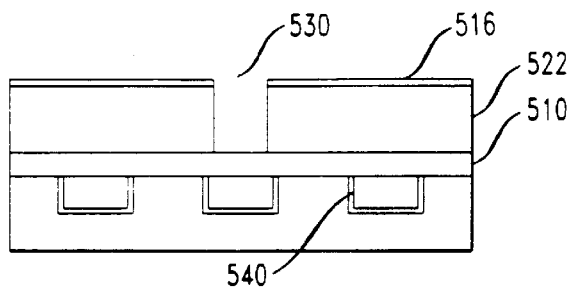

As shown in FIG. 5(B), an Si nitride film (SiN) 570 having a film thickness of 100 nm and an Si oxide film (SiO$_2$) 522 having a film thickness of 600 nm are deposited as insulating films using a conventional CVD technique. A film of TiN 516 is formed over the SiO$_2$ film 522. The thickness of the TiN film 516 is selected so that a portion will remain after subsequent processing because a portion of the subsequently formed second level of metal (550 in FIG. 5E) is formed thereover. A via hole 530 is formed using photolithography to define the pattern for the hole followed by reactive ion etching (RIE). A trifluormethane (CHF$_3$) plasma is used for the RIE and the etching is stopped at the SiN layer 570. The photoresist mask used for the etching is subjected to an oxygen plasma process and is removed with an organic solution. The lithographic process used to from the pattern for the via holes 530 in the substrate is conventional and well known to one skilled in the art.

Figure 5C:
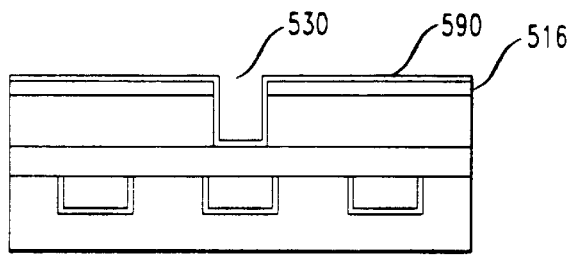
Figure 5D:
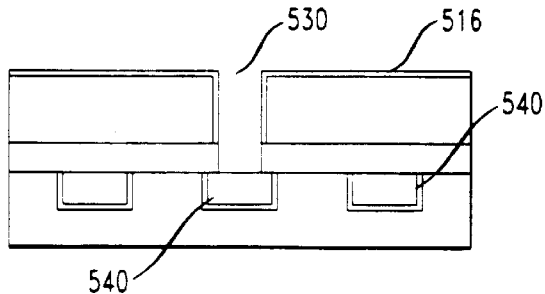
Figure 5E:
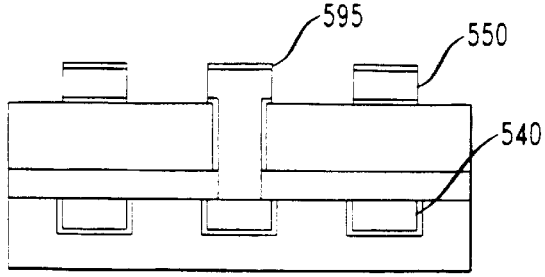

As shown in FIG. 5(C), a TiN film 590 having a film thickness of 30 nm is deposited on the entire surface of the structure and is subjected to an etch-back operation by RIE using trifluoromethane ($CHF_3$) plasma to sequentially remove the TiN layer 590 and the SiN 570 and to expose the surface of the copper 540 (FIG. 5(D)). The contamination that occurs on the surface of the copper 540 as a result of the $CHF_3$ plasma is removed using an oxygen plasma. Exemplary oxygen plasma conditions are a pressure of one Torr, an RF power of 100 W and a processing time of one minute.

The substrate is immersed in a dilute hydrofluoric acid solution, which is obtained by mixing one part by volume of hydrofluoric acid with 100 parts by volume of water for 15 seconds. After that, the substrate is washed with pure water for five minutes and dried.

A gas process using hexafluoro-acetyl-acetone gas (Hhfac) is performed as follows. The Hhfac atmosphere (either pure Hhfac gas or Hhfac gas combined with a non-reactive carrier gas such as nitrogen) is provided at a pressure of about 1 torr to about 760 Torr and a temperature of about 150° C. to about 250° C. In one embodiment, the substrate is exposed to the Hhfac atmosphere for ten minutes with the substrate temperature equal to 200° C. and the pressure equal to 10 Torr. The pressure of the Hhfac atmosphere is about 1 Torr to about 760 Torr. By this process, the oxidized copper on the surface of copper is substantially removed.

Copper of a film thickness of 800 nm is deposited on the structure depicted in FIG. 5(D) according to the CVD method. It is advantageous if the copper is deposited in a vacuum just after the Hhfac gas process. Then, a TiN film 595 with a thickness of 50 nm is deposited on the copper as a barrier metal using conventional sputtering techniques. An $SiO_2$ oxide film pattern etching mask is formed by photo-lithography and RIE, and the TiN film 595 and the copper film are selectively subjected to RIE using a boron trichloride ($BCl_3$) plasma, thereby forming the second level of wire 550 (FIG. 5(E)).

Figure 6A:
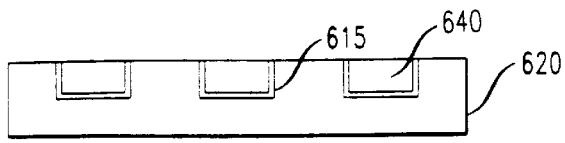
FIGS. 6(A)–6(E) illustrate the process used to form the device in FIG. 2.

As shown in FIG. 6(A), the first level of wire 640 is formed in a layer of $SiO_2$ 620 in the manner previously described. The method is the same as that in the first embodiment.

Figure 6B:
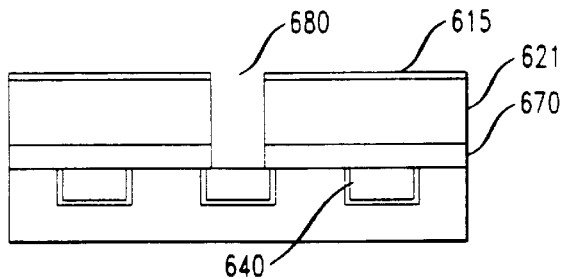

Referring to FIG. 6(B), a 100 nm-thick SiN film 670 and a 600 nm-thick $SiO_2$ film 621 are deposited as insulating films using a conventional CVD process. A layer of barrier metal 615 such as TiN is formed over the $SiO_2$ layer 621. A via hole pattern is formed by photolithography and the reactive ion etching (RIE) is performed, thereby forming via holes 680. A trifluoromethane ($CHF_3$) plasma is suitable for forming the via holes 680. The etching operation is stopped at the SiN layer 670. After the photoresist etch mask (not shown) is subjected to an oxygen plasma, it is removed with an organic solution. The SiN film 670 is then subjected to RIE using a trifluoromethane ($CHF_3$) plasma and the surface of the wire 640 of the first level is exposed.

Figure 6C:
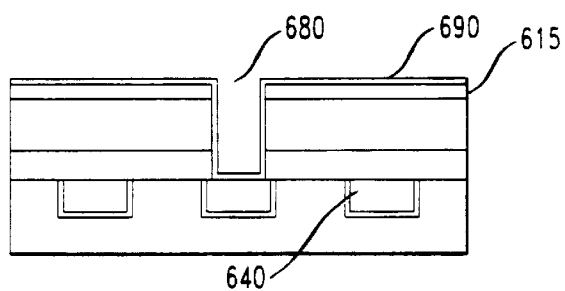

The substrate illustrated in FIG. 6(B) is immersed in a dilute hydrofluoric acid solution, which is obtained by mixing one part by volume of hydrofluoric acid with 100 parts by volume of water for 15 seconds. After that, the substrate is washed with water for five minutes and then dried. By this cleaning treatment, the copper adhering to the sidewalls of the via 680 from the sputtering of the copper on the bottom of the via 680 as a result of RIE is lifted off. Fluorocarbons adhering to the sidewalls of the via 680 are also removed. A TiN film 690 of a film thickness of 30 nm is deposited over the substrate surface (FIG. 6(C)).

Figure 6D:
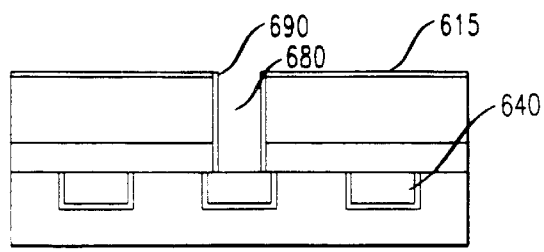

As before, an RIE etch back operation using trifluoromethane ($CHF_3$) plasma is executed and TiN 690 is removed at the bottom of the via 680 to expose the surface of copper 640 (FIG. 6(D)). Although the surface in the via is contaminated by the byproducts of the $CHF_3$ etch, the contaminants are removed using an oxygen plasma. Exemplary of suitable conditions include a pressure of one Torr, an RF power of 100 W, and a processing time of one minute. The substrate is then immersed in a dilute hydrofluoric acid solution, which is obtained by mixing one part by volume of hydrofluoric acid with 100 parts by volume of water, for 15 seconds. After that, the substrate is washed with water for five minutes and then dried.

Subsequently, the substrate depicted in FIG. 6(D) is placed in a vacuum chamber and is exposed to the previously described Hhfac atmosphere for ten minutes with the substrate temperature equal to 200° C. and pressure of 10 Torr. By this process, the oxidized copper on the surface of copper 640 is substantially removed.

Figure 6E:
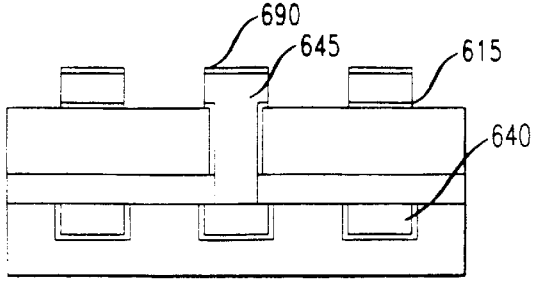
Figure 7A:
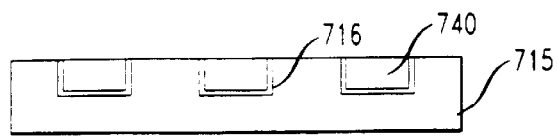
FIGS. 7(A)–7(E) illustrate the process used to form the device in FIG. 4.
Figure 7B:
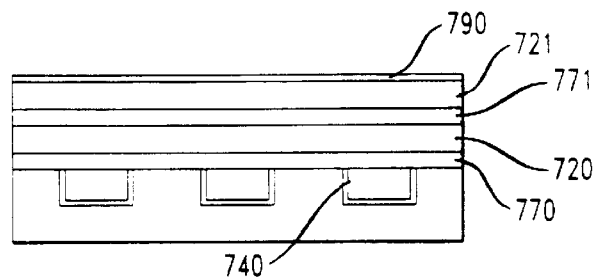
Figure 7C:
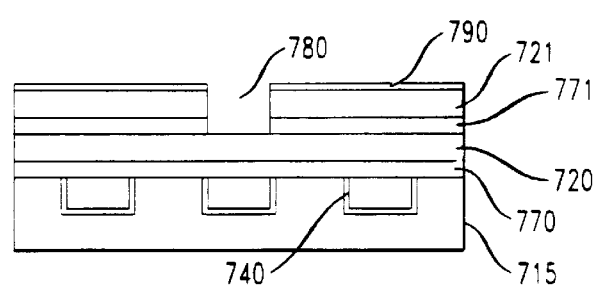
Figure 7D:
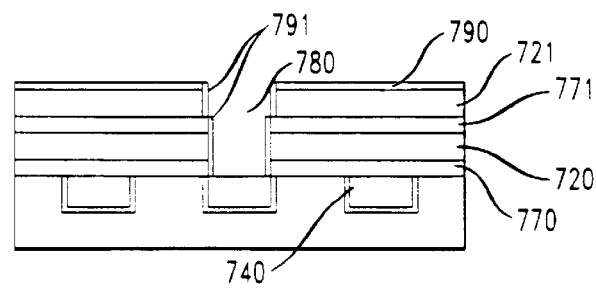
Figure 7E:
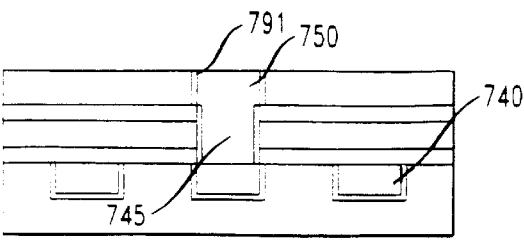

A copper film of 800 nm thickness is formed on the structure depicted in FIG. 6(D) using a conventional CVD technique. It is advantageous if the substrate is maintained under vacuum during the copper deposition and Hhfac steps. Further, a 50 nm-thick TiN film 690 is deposited as a barrier metal on the copper. An $SiO_2$ film pattern etching mask is formed by photo-lithography and RIE. The TiN 690 and the copper film are selectively subjected to RIE using a boron trichloride plasma, thereby forming the second level of wire 645 (FIG. 6(E)).

FIG. 7 illustrates another embodiment of the present invention.

In a manner similar to the foregoing embodiment, after the first layer of wire 740 is formed, films are deposited by CVD in the following order SiN 770, $SiO_2$ 720, SiN 771 and $SiO_2$ 721. The film thickness are 100 nm, 600 nm, 200 nm and 500 nm, respectively. A TiN film 790 having a film thickness of 50 nm is deposited by a conventional expedient such as sputtering (FIG. 7(B)).

The pattern of the via holes is formed by photolithography, and RIE using a $CHF_3$ plasma is used to transfer the hole into layers TiN 790, $SiO_2$ 721, and SiN 771 using a $CHF_3$ plasma, thereby forming the via holes 780. The etching stops at the lower $SiO_2$ layer 720 (FIG. 7(C)).

The grooves (not shown) for the second level of wire are formed in layers 790 and 721 using photolithography followed by RIE. At the time of the etching, the via hole 780 becomes deep as hole etches into and through layers 720 and 770. The etching time is controlled so that the etching is stopped when it reaches the lower layer of SiN 770 in the via hole 780. The resist mask (not shown) is removed and the SiN 770 is etched to expose the surface of the copper wire 740. A 30-nm thick TiN film 791 is deposited over the entire surface and is etched back by RIE using trifluoromethane ($CHF_3$) plasma so that the TiN 790 at the bottom of the via hole is selectively removed and the surface of the copper 740 is again exposed (FIG. 7(D)).

As previously described, an oxygen plasma process is used to remove contamination on the walls and bottom of the via 780. An $O_2$ plasma with a pressure of one Torr, an RF power of 100 W and a processing time of one minute is an example of suitable plasma conditions. The substrate is immersed in a dilute hydrofluoric acid solution as described previously, for 15 seconds. The substrate is then washed with water for five minutes and is dried. The substrate is then subjected to the Hhfac environment previously described.

Subsequently, an 800 nm-thick copper film (thickness of the blanket film; the via was filled when a blanket film of this thickness was formed on the substrate) is deposited on the substrate using CVD. It is advantageous for the copper to be deposited in a vacuum just after the Hhfac gas process. Finally, the copper and the TiN 790 are subjected to the etch back operation using chemical mechanical polishing (CMP) method to form the via plug 745 and the second level of metal wire 750.

When the copper surface at the bottom of the via hole (prior to the formation of the via plug) is examined by an X-ray photoelectron spectroscopy (XPS), the copper oxide film on the surface is substantially removed and a pure copper surface is obtained. On the other hand, when only dilute hydrofluoric acid solution is used to clean the via prior to the formation of the via plug (which is the conventional prior art method), univalent copper oxide is still detectable on the copper surface. The univalent copper oxide is essentially removed by the Hhfac gas.

The resistivity of the copper via connecting portion produced by the process of the present invention is about $1.5 \times 10^{-9}$ $\Omega$-cm$^2$ or less. This corresponds to a resistance of 2 $\Omega$ or less for a via connecting portion in a via hole having a diameter of 0.3 microns. As noted above, this is $\frac{1}{10}$ the resistivity of copper-copper connecting portions fabricated using a method that does not utilize the Hhfac cleaning step prior to the formation of the via plug.

As described in the embodiments, the homogeneous junction structure of the invention has an advantageous resistance. Although the cause of the high contact resistivity in the conventional structure and fabricating method is not certain, and applicants do not wish to be held to a particular theory, a factor to be considered is an alloy having high resistivity is formed by a reaction between the boron that is implanted in the copper metal to prevent oxidation and the barrier metal (Ta) or a reaction between the copper and Ta. Since dilute hydrofluoric acid does not remove all the copper oxide film from the copper surface, prior art devices in which the copper surface of the first level metal wire is cleaned using dilute hydrofluoric acid have a higher resistance in the interconnect between the first level metal wire an the via plug than the device of the present invention.

What is claimed is:

1. A method of fabricating a device with wires on at least two levels thereof comprising:

forming a wire first level of wire in a substrate, wherein the wire is copper or a copper-containing metal;

forming an insulating film over the first level of wire;

forming at least one via in the insulating film, wherein the via communicates with at least one wire in the first level;

forming a barrier metal layer over the surface of the substrate with the via formed therein;

etching the substrate using an anisotropic reactive ion etch so that the barrier metal is selectively removed from at least the bottom of the via;

subjecting the substrate to an oxygen or hydrogen plasma;

immersing the substrate in an aqueous solution of hydrofluoric acid; and exposing the substrate to a reactant gas for a time sufficient to remove essentially all of the oxide on the exposed surface of the first level metal; and forming via plugs by depositing copper or a copper containing metal in the via.

2. The method of claim 1 wherein the reactant gas is hexafluoro-acetyl-acetone gas.

3. The method of claim 2 wherein the substrate is maintained under vacuum conditions until after the metal is formed in the via.

4. The method of claim 3 wherein the substrate is exposed to the hexafluoro-acetyl-acetone gas under vacuum.

5. The process of claim 4 wherein the resistivity of a copper or copper-containing connecting portion between the first level of copper or copper-containing metal and the copper or copper-containing via plug is about $1.5 \times 10^{-9}$ $\Omega$-cm or less.

6. The method of claim 5 wherein the resistance of the copper-containing metal connecting portion between the first level of copper or copper-containing metal and the copper or copper-containing metal via plug is about 2 $\Omega$ or less.

* * * * *